United States Patent [19]

Collier

[11] Patent Number: 4,963,845

[45] Date of Patent: Oct. 16, 1990

[54] SYNTHESIS OF ELECTRICAL IMPEDANCES

[76] Inventor: Robert L. Collier, 305 W. 20th, Austin, Tex. 78705

[21] Appl. No.: 329,946

[22] Filed: Mar. 29, 1989

[51] Int. Cl.$^5$ .................................. H03H 11/48
[52] U.S. Cl. .................................. 333/214; 333/216; 333/217
[58] Field of Search ........................ 333/213-217

[56] References Cited

U.S. PATENT DOCUMENTS 3,735,288  5/1973  Strauss ................ 330/107 U X
4,025,867  5/1977  Seidel ................. 333/214 X
4,779,056 10/1988  Moore et al. ........... 330/107

OTHER PUBLICATIONS

Simulated Inductance for Low Frequency Filter, Electronic Engineering, Nov. 1976, p. 19.
Pookaigaudom et al., An Integratable Precision Current-Controlled Negative Impedance Converter, Proc. of IEEE, Jun. 1978, pp. 706–708.

Primary Examiner—Paul Gensler
Attorney, Agent, or Firm—Nevin Shaffer

[57] ABSTRACT

A monodirectional, current-reducing impedance magnifier (MCRIM) provides continuously variable magnification of any general impedance $Z_0$ without affecting its phase charateristics. The monodirectional, current-reducing impedance magnifier circuit realizes floating resistors, inductors and capacitors, suitable for use over any range of frequencies, and the simulated impedance is continuously user-variable over wide ranges. In another embodiment, a monodirectional, generalized impedance synthesizer (MGIS) permits simulation of user-variable floating impedances whose phase and frequency characteristics are widely subject to design objectives. In addition to realizing all conventional circuit elements R, L and C, including positive and negative values thereof, the MGIS produces an infinite set of alternatives for the simulation of user-variable resistance and reactance functions of frequency. The MGIS is also usable over any bandwidth.

5 Claims, 2 Drawing Sheets

SYNTHESIS OF ELECTRICAL IMPEDANCES

FIELD OF THE INVENTION

This invention relates generally to the realization of electrical impedances, and in particular to the simulation of basic circuit impedance elements such as resistors, capacitors and inductors by active networks.

BACKGROUND OF THE INVENTION

The individual components present in an electrical circuit are called circuit elements. The basic circuit elements describe physical processes such as the energy storage in a magnetic field (inductor), the energy storage in an electric field (capacitor) and the dissipation of electromagnetic energy (resistance). The behavior of these circuit elements may be completely described by their terminal voltage-current relationships within the time domain or the frequency domain.

Practical versions of these circuit elements deviate from the idealized model at high frequencies due to parasitic impedance effects. For a resistor, in general, there are reactive effects due to the winding of the resistance wire and the stray capacitance across the resistor. The practical version of an inductor is not a lossless element, and the effect of energy dissipation by resistive heating is observed. Practical capacitors are also lossy because of losses in the dielectric, and the terminal wires also have an inductive effect.

Circuit elements having predetermined values may be selected and combined in a network to produce a prescribed output in response to a defined excitation to its input. The desired circuit behavior, such as frequency response, can be adversely affected by parasitic impedances. Moreover, some circuits may require the use of variable resistors, inductors and capacitors. Variable inductors and variable capacitors can be realized with the aid of mechanical devices, but at substantial increases in component size and mass, increases in dissipation and parasitic effects and increases in production costs with corresponding reductions in marketing revenues.

Generally, the inductance of a coil is proportional to the number of winding turns and the cross-sectional area of the coil structure. These values are not conveniently subject to continuous user variation, and the physical size and weight of an inductor will increase as higher inductance values are realized. An increase in the number of winding turns increases the resistance of the winding, which can vary from around one ohm per 1,000 feet for No. 12 gauge wire, to over 1,600 ohms per 1,000 feet for No. 42 gauge wire. The inductance value can also be increased by increasing the permeability of the core. However, losses in the heating of magnetic cores due to eddy currents and hysteresis increase in direct proportion to frequency. Dielectric losses in the coil winding insulation also increase at higher frequencies and are determined by the power factor of the distributive capacity. Moreover, most ferrite core materials will saturate in response to AC flux densities in the region of 3,000 to 4,000 Gauss. Thus the use of magnetic cores to vary the inductance value introduces losses which limit the performance of the inductor at high frequencies.

The selection of practical capacitors for use in a specific network is also limited by parasitic elements such as inductance and resistance. Moreover, since miniaturization is usually a prime consideration, the smallest possible capacitors will require thin dielectrics and efficient packaging without degrading performance. This severely limits prospects for user variation of the capacitance. Another important consideration in the selection of capacitors for use in certain LC filters is the figure of merit Q which is inversely proportional to the excitation frequency. The capacitor figure of merit Q must be sufficiently higher than the inductor figure of merit so that the effective figure of merit of the LC combination will not be degraded.

In certain LC filters, particularly those for radio frequency use, it is sometimes found more convenient to resonate a tuned circuit by adjusting the capacitance C rather than the inductance L. In such circuits, a small variable trimmer capacitor is connected in parallel with a fixed resonating capacitor. Such a parallel capacitance can be varied from its mean value by only a small percentage. The trimmer capacitors usually employ air, ceramic, mica or glass as a dielectric. Air capacitors consist of two sets of plates, one called a rotor, which is mounted on a shaft, and the other called the stator, which is fixed. As the rotor is revolved, the plates intermesh without making contact, resulting in increasing capacitance. For a large range capacitance variation, the plate size and number must be increased dramatically, especially if air is used as the dielectric. This becomes a serious limitation when the component mass or the available component space is restricted.

The resistor R is a fundamental component of active filters. Sensitivity studies have shown that the resistor components are usually at least as significant as capacitors. Accordingly, the selection of the appropriate resistor is critical to the success of a particular network design. In some networks, it is desirable to provide an identically constant negative resistance for exciting natural oscillation in passive LC circuits. However, the realization of such absolutely negative resistance values is not possible without the use of active elements.

It will be appreciated, therefore, that the parasitic effects associated with conventional inductors, capacitors and resistors, as well as constraints on physical size and mass, impose serious limitations on the design of networks which utilize passive R, L and C circuit elements, exclusively.

DESCRIPTION OF THE PRIOR ART

Circuits are known for producing simulated inductors through the use of active circuit elements such as gyrators. The first circuit for simulating electrical inductances through the use of a gyrator was demonstrated by Tellegen in 1948 in connection with the design of a high quality filter of the type commonly used in the telephone industry in which each inductor in a conventional LC ladder filter was replaced by the gyrator circuit that simulated an inductor. This approach was taken to achieve a figure of merit Q factor in excess of 500, which was required because of the high order of the filter. Such high Q factor filter networks were otherwise practically unattainable because of parasitic impedances associated with passive inductor components.

Conventional gyrator circuits which simulate electrical inductors have been operated from a common grounded power supply, and have been restricted to simulating inductors that have one terminal which is connected to fixed (ground) potential. That is, although an inductor L was simulated by using analog circuit components such as resistors and capacitors in combination with an active gyrator, the simulated inductor was constrained to operate with one of its terminals permanently grounded. It will be appreciated that the grounded terminal inductor realization is completely useless in the design of low pass LC filters, while such grounded terminal simulated inductors could be used in the design of high pass filters and band pass filters with poles of loss in the lower stop band. For many circuits, including the low pass filter network, no alternatives to the use of a floating inductor have been proposed.

Recently, a digital switching method known as the switched capacitor technique has been developed to simulate floating reactances, but these techniques are quite complicated compared to the simple tasks they perform, and their frequency responses are limited by system clocking frequencies. This renders them useless for most radio frequency applications.

OBJECT OF THE INVENTION

Accordingly, the principal object of the present invention is to provide a general, practical and predetermined circuit for simulating a floating electrical impedance $Z_{SIM}$ having any desired phase-angle and frequency-dependence characteristics, whose general magnitude may be user-varied over a wide and continuous range, and which can be incorporated for use over any range of frequencies.

SUMMARY OF THE INVENTION

A necessary (and often sufficient) condition for the simulation of the impedance $Z_{SIM}$ is that the potentials E and E' of two floating terminals be related to the current I entering the terminal of potential E by the equation $$E-E'=IZ_{SIM}.$$

This insures that the terminal of potential E, which the current is defined as entering, is coupled to the potential E' by the impedance $Z_{SIM}$. If, due to internal active components, the current I' entering the terminal of potential E' is not identical to the negative of I, then $Z_{SIM}$ is characterized as being a monodirectional impedance whose passive terminal has the passive potential E and whose (other) autonomous terminal is driven by the autonomous E'. Monodirectional impedances are simpler and less costly to simulate, and they may be used to couple any load to any self-governing (autonomous) source of potential, such as the output from an amplifier, transducer or power supply.

If, instead, the current I' is identical to the negative of I, then $Z_{SIM}$ is said to be bidirectional, and its two terminals are electrically indistinguishable.

The present invention provides both monodirectional and bidirectional impedances having the characteristics previously described.

Basic circuit impedances (R, L, C) having one passive source terminal and one autonomous source terminal are realized, according to one aspect of the present invention, in which the passive source terminal of the simulated impedance is coupled to its autonomous source potential by a monodirectional currentreducing impedance magnifier circuit (MCRIM). The monodirectional coupling impedance is given by the relation:

$$Z_{CRIM}=Z_0R/R_T$$

where $Z_0$ is a terminal impedance circuit element, for example a resistor, inductor or capacitor; R is the maximum value of a continuously variable potentiometer; and $R_T$ is the tapped divider resistance value. The monodirectional coupling impedance $Z_{CRIM}$ is realized by connecting the terminals of the potentiometer across the autonomous terminal and the passive terminal, with the variable tapped terminal of the potentiometer defining a voltage divider output. In this arrangement, the output resistance of the voltage divider is $R_T$ and the input resistance is $R-R_T$.

The voltage divider output is connected to the input of a unity gain voltage follower amplifier. The output of the unity gain voltage follower amplifier is coupled to the passive source terminal E by an impedance $Z_0$, that is any R, L or C, or two-terminal combination thereof, which is to be magnified and rendered monodirectional. According to this arrangement, the virtual impedance coupling the passive source terminal E to the autonomous source potential $E_A$ is $Z_0$ magnified by the real factor $R/R_T$.

The magnification factor $R/R_T$ is bounded below by 1 for $R_T=R$. The magnification factor $R/R_T$ is bounded above only by the voltage follower amplifier's tolerance for positive feedback. Because the potentiometer R is continuously variable over the extent of its range, the impedance $Z_{CRIM}$ is also continuously variable through the range:

$$|Z_0|\leq|Z_{CRIM}|\leq|Z_F|$$

where $Z_F$ is the upper limit achieved by the real factor $R/R_T$ as limited by the positive feedback stability voltage follower amplifier.

According to another aspect of the invention, the use of an active circuit element to realize a monodirectional impedance also makes possible the realization of an n-stage monodirectional general impedance synthesizer (MGIS) in which an arbitrary impedance $Z_0$ is magnified by an arbitrary complex impedance function.

The ability to realize synthetic impedances for general applications depends upon the use of active circuit elements such as the voltage follower in the current-reducing impedance magnifier circuit, and the differential amplifier in the general impedance synthesizer. The use of the active device permits any charge source connected to the passive input terminal to be directly coupled to a predetermined output potential V through a preselected impedance $Z_0$, to produce a net current entering the passive terminal from the aforesaid charge source which is identical to the current that the charge source would deliver into the designated synthetic impedance if it coupled the charge source to the autonomous potential $E_A$.

The active device and the impedances with which it interacts enforces the essential relationship between voltage and current which produces the desired characteristic impedance and will have an identical effect on the circuit in which the impedance is connected, provided that the potential of the autonomous terminal is governed by an autonomous driver.

Operational features of the invention will be appreciated by those skilled in the art upon reading the detailed description which follows with reference to the attached drawings.

DESCRIPTION OF THE PREFERRED EMBODIMENTS

In the description which follows, two general circuits are disclosed for the synthesis of user-variable electrical impedances, such as resistors, inductors and capacitors.

Figure 2A:
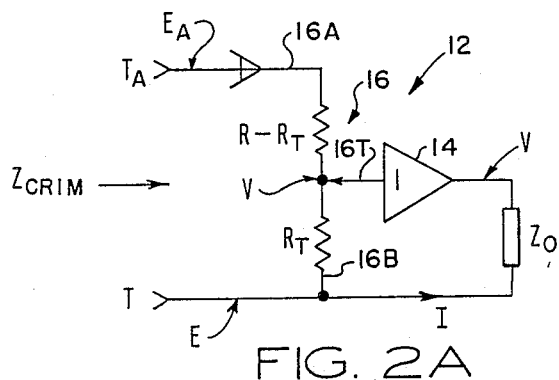
FIG. 2A is a circuit diagram of a monodirectional, current-reducing impedance magnifier (CRIM)

The first general circuit, shown in FIG. 2A, is a monodirectional, current-reducing impedance magnifier (MCRIM) which provides continuously variable magnification of any general impedance $Z_0$ without affecting its phase characteristics. The monodirectional, current-reducing impedance magnifier circuit realizes floating resistors, inductors and capacitors which are continuously variable over wide ranges.

Figure 6:
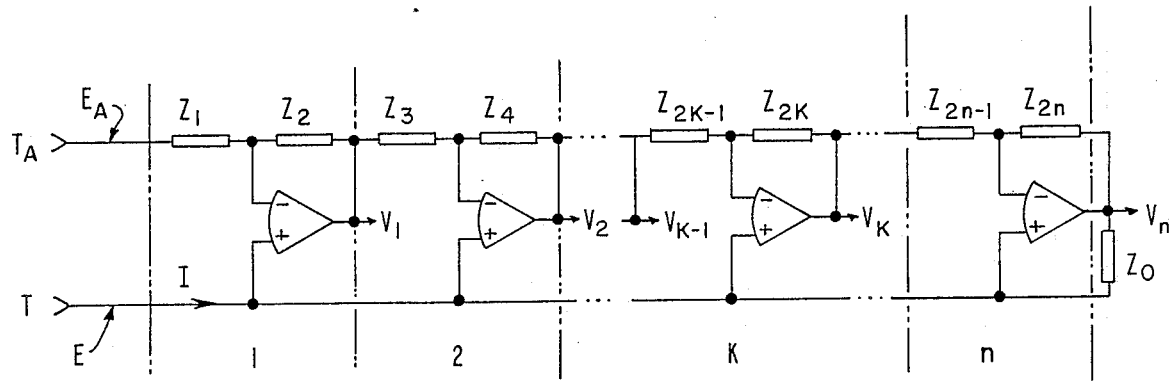

The second general circuit shown in FIG. 6 is a monodirectional, generalized impedance synthesizer (MGIS) which permits simulation of user variable floating impedances whose phase and frequency characteristics are widely subject to design objectives. In to realizing all conventional circuit elements R, L and C, including positive and negative values thereof, the MGIS produces an infinite set of alternatives for the simulation of resistance and reactance functions of frequency.

The following description is approached exclusively from the perspective of phasor analysis. It may be shown by Laplace and Fourier transform theory that the phasor analysis provided herein carries over faithfully in the time domain analysis.

The impedance magnifier and the impedance synthesizer circuits described herein are said to be monodirectional, and the monodirectional impedances realized by these circuits are intended for coupling passive sources to autonomous sources.

Figure 1:
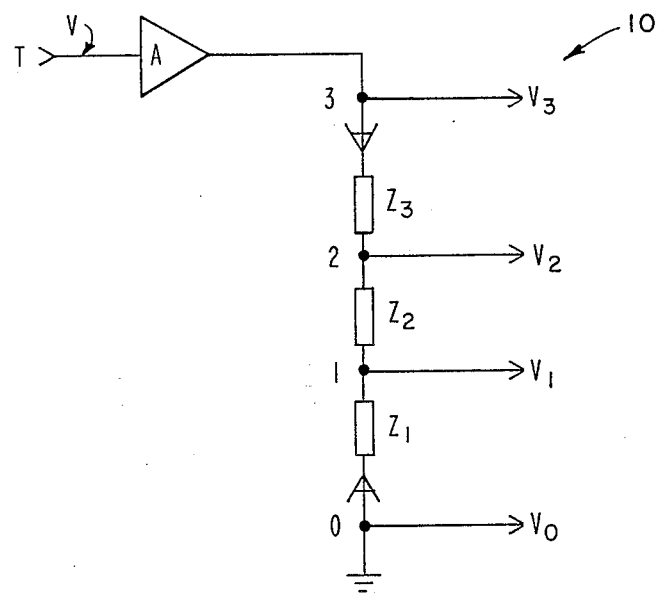
FIG. 1 is a circuit diagram which illustrates a voltage divider circuit having autonomous and passive source terminals.

The voltage divider circuit 10 of FIG. 1 provides an illustrative example for defining the foregoing concepts. The directed A symbol is used herein to denote autonomy of the potential and terminal with which it is associated. That is, terminals 0 and 3 and potentials $V_0$ and $V_3$ are autonomous.

One definitive demonstration of the autonomy of terminals 0 and 3 is to replace each A symbol with an ideal voltage follower, and observe that the characteristic behavior of the circuit remains unchanged. In contrast, insertion of an ideal voltage follower at terminal 1 or 2 in either orientation will upset the characteristic behavior of the voltage divider 10.

Unlike the autonomous potentials, potentials $V_1$ and $V_2$ are vitally dependent upon the currents at terminals 1 and 2. Accordingly, terminals 1 and 2 and potentials $V_1$ and $V_2$ will be referred to as passive, because their voltages depend vitally upon their currents or, equivalently, because they are not autonomous.

Because terminals 0 and 3 autonomous, the impedances $Z_1$ and $Z_3$ may be monodirectional. The characteristic distinction of a monodirectional impedance is that its terminals are not mutually coupled as are the terminals of a conventional bidirectional impedance. Instead, the passive terminal of each monodirectional impedance is coupled to its autonomous potential through the respective simulated impedance $Z_1$, $Z_3$, respectively, while the autonomous terminals 0, 3 may be coupled directly to their respective passive source potentials $V_1$ and $V_2$ through separate bilateral impedances. The currents flowing at terminals 1 and 2 of the voltage divider network 10 must be identical if a conventional divider function is to be provided. This requires that $Z_2$ be a bidirectional impedance, meaning simply that it cannot be monodirectional.

The Current-Reducing Impedance Magnifier Circuit (CRIM)

Referring now to FIG. 2A, a passive source terminal T is coupled to an autonomous source terminal $T_A$ by a monodirectional, current-reducing impedance magnifier circuit 12. By the convention defined above, the directed A symbol designates its autonomous terminal. The symbols E and $E_A$ represent the passive and autonomous source potentials, respectively. The amplifier 14 is a voltage follower having unity gain, a large input impedance and a small output impedance.

In this arrangement, a fundamental circuit element, for example R, L or C having one passive source terminal and one floating autonomous source terminal, is realized by coupling its passive source terminal T to its autonomous source terminal $T_A$ by a monodirectional, current-reducing impedance magnifier circuit 12. The monodirectional coupling impedance is given by the following relation:

$$Z_{CRIM} = Z_0 R / R_T$$

where $Z_0$ is an arbitrary impedance circuit element, R is the maximum value of a continuously variable potentiometer 16, and $R_T$ is the tapped divider resistance value. The resistance R is chosen large enough that its current drain will be negligible.

The monodirectional coupling impedance $Z_{CRIM}$ is realized by connecting the terminals 16A, 16B of the variable potentiometer meter 16 to the autonomous source terminal $T_A$ and the passive source terminal T, respectively, with the variable tapped terminal 16T defining a voltage divider output, the output resistance of the voltage divider being R and the input resistance being $R - R_T$. The voltage divider output conductor 16T is connected to the input of the unity gain voltage follower amplifier 14. The output V of the unity gain voltage follower amplifier is coupled to the passive source terminal T by the impedance $Z_0$. The impedance $Z_0$ may be any impedance which is to be magnified.

According to the foregoing arrangement, the virtual impedance $Z_{CRIM}$ coupling the passive source terminal T to the autonomous source potential $E_A$ is $Z_0$ magnified by the real factor $R/R_T$. The magnification factor $R/R_T$ is bounded below by 1 for the condition $R_T = R$. The magnification factor $R/R_T$ is bounded above only by the tolerance of the voltage follower amplifier 14 for positive feedback. Because $R/R_T$ is continuously variable over the range of all real numbers exceeding 1, the monodirectional impedance $Z_{CRIM}$ is also continuously variable through the range:

$$|Z_0| \leq |Z_{CRIM}| \leq |Z_F|$$

where $Z_F$ is the maximum value permitted by amplifier stability constraints as $R_T$ approaches 0.

Figure 2B:
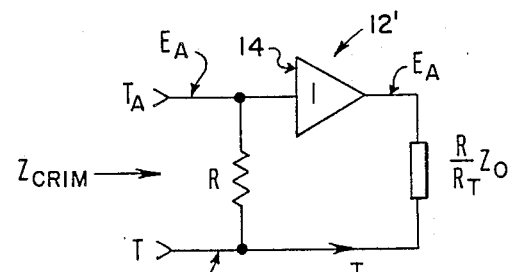
FIG. 2B is an equivalent circuit representation of the monodirectional, current-reducing impedance magnifier circuit of FIG. 2A.

Referring now to FIG. 2B, it will now be shown that the circuit 12' is equivalent to the monodirectional currentreducing impedance magnifier circuit 12 shown in FIG. 2A.

The current $I_b$ flowing from the passive source terminal T will now be shown to be identical to the current I flowing through the passive source terminal T in the equivalent circuit of FIG. 12, to establish the equivalence of the monodirectional coupling impedances $Z_{CRIM}$.

First, it is readily seen that for the circuit 12' shown in FIG. 2B, $$I_b = (E - E_A)/R Z_0/R_T).$$

The potential V at the output of the voltage follower 14 in the MCRIM circuit 12 is identical to the potential at the tap 16T of its resistance voltage divider. Ohm's and Kirchhoff's laws readily establish that $$V = E - (R_T/R)(E - E_A).$$

The passive charge source, having potential E, is forced to supply charge to the passive terminal T at the rate $$I = (E - V)/Z_0.$$

Upon eliminating V from these equations, $$I = (E - E_A)/(RZ_0/R_T),$$

thus establishing equivalence of the monodirectional coupling impedances, yielding $$Z_{CRIM} = Z_0 R/R_T.$$

As seen by the passive source potential E, the virtual impedance coupling it to the autonomous potential $E_A$ is $Z_0$ magnified by the real factor $R/R_T$. This magnification factor is bounded below by 1 wherein $R_T = R$. Under this condition, $V = E_A$, and $Z_0$ directly couples the passive terminal T to the autonomous potential $E_A$. The magnification factor is bounded above only by the follower's tolerance for positive feedback, for when $R_T = 0$, the follower's input and output are connected directly through $Z_0$. If the follower is unstable as such, then the user must settle for a finite upper magnitude for $Z_{CRIM}$. Otherwise, $$|Z_0| \leq |Z_{CRIM}| \leq \infty.$$

The frequency-independent magnification of an inductive reactance is equivalent to increasing its apparent inductance L. As such, any high Q air-core inductance may be magnified to become a large high Q inductance, which is not affected by hysteresis. The frequency-independent magnification of a capacitive reactance is equivalent to decreasing its apparent capacitance. Accordingly, any fixed capacitance may be rendered variable with the fixed capacitance being the maximum value, thereby providing very large variable, high Q capacitances that are small in volume and mass.

A bidirectional CRIM (BCRIM) may be produced by wiring two identical MCRIMs in "symmetric parallel", so that each terminal is coupled to the other by one of the MCRIM impedances. A dual-ganged pot is necessary for permitting simultaneous, continuous variation in the two balanced coupling impedances.

If desired, the impedance $Z_0$ may be monodirectional, for the CRIM's follower output is autonomous. In addition, the impedance $Z_0$ has no restrictions on its phase or frequency characteristics, for it needs only to appear to the CRIM's passive source as a two-terminal current pathway that couples it to the potential V, and which may be expressed as a mathematical impedance.

The Generalized Impedance Synthesizer (GIS)

Figure 3A:
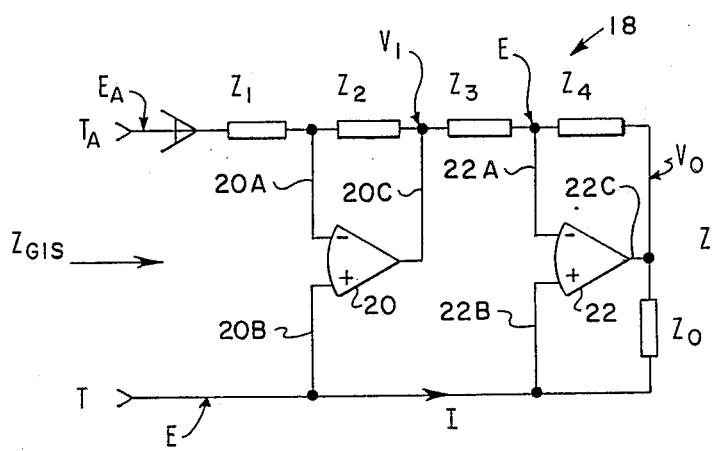
FIG. 3A is a circuit diagram of a two-stage monodirectional general impedance synthesizer (GIS)
Figure 3B:
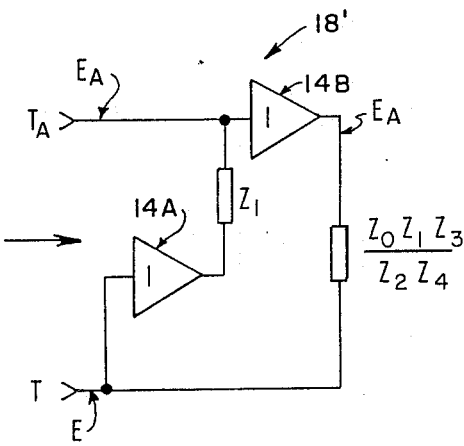
FIG. 3B is an equivalent circuit representation of the two-stage general impedance synthesizer shown in FIG. 3A.

Referring now to FIGS. 3A and 3B, a two stage (n=2) monodirectional, generalized impedance synthesizer 18 and its equivalent circuit 18' are illustrated.

The first stage consists of the input amplifier (shown on the left) and the impedances $Z_1$, $Z_2$. The second stage (the final stage for n=2) consists of the amplifier shown on the right and the impedances $Z_3$, $Z_4$.

The GIS circuit 18 employs differential amplifiers 20, of very large input impedances and very high gain, such as operational voltage amplifiers (op-amps). It will be assumed that these internal amplifiers behave as op-amps of adequate bandwidth. The assumptions of infinite input impedances and voltage gain are sufficient to predict the (load-free) output potential $V_1$ from the first stage, $$V_1 = E + (Z_2/Z_1)(E - E_A).$$

Employing $V_1$ for the inverted input to the latter stage with E as its noninverted input, the latter (unloaded) output potential 22C is found to be $$V_0 = E - (Z_2 Z_4/Z_1 Z_3)(E - E_A).$$

Having the potential E, the passive charge source is forced by the impedance $Z_0$ to supply charge to the passive terminal at the rate $$I = (E - V_0)/Z_0.$$

Upon eliminating $V_0$, $$I = (E - E_A)/(Z_0 Z_1 Z_3/Z_2 Z_4).$$

Accordingly, the passive terminal is coupled to the autonomous potential through a monodirectional impedance of $$Z_{GIS} = Z_0 Z_1 Z_3/Z_2 Z_4.$$

The inverted input 20A to the first op-amp 20 follows the potential E, requiring that current flow in $Z_1$. As such, the autonomous terminal $T_A$ is coupled to the passive terminal T by the impedance $Z_1$, as indicated by the equivalent circuit shown in FIG. 3B.

Figure 4A:
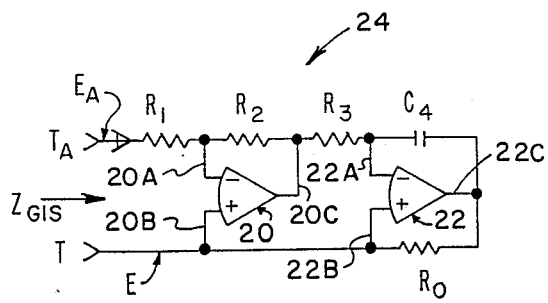
FIG. 4A is a two stage general impedance synthesizer which realizes a monodirectional inductive reactance.

By employing resistances $R_1 = Z_1$ throughout the circuit except for a capacitance $C_4$ to produce a capacitive reactance for $Z_4$, as shown in the circuit 24 of FIG. 4A, the GIS coupling impedance becomes $$Z_{GIS} = j\omega(R_0 R_1 R_3 C_4/R_2),$$

which is an inductive reactance.

If it is assumed that $E_A$ must be the ground zero potential, this circuit becomes a conventional gyrator circuit; but, of course, $E_A$ may be any autonomous potential. By using the resistance of a potentiometer for the total resistance $R_2 + R_3$ and feeding the potentiometer tap with the output 20C from the first stage, the potentiometer can be used to vary the ratio $R_3/R_2$ between zero and infinity, permitting equivalent extremes for the simulated inductive reactance $Z_{GIS}$.

Figure 4B:
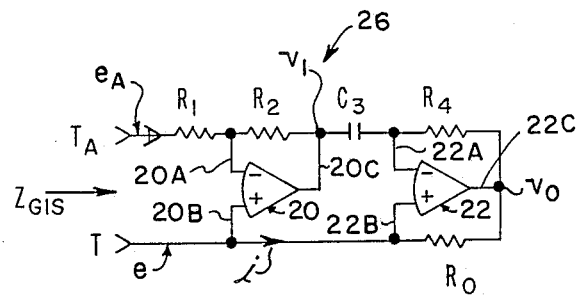
FIG. 4B is a two stage monodirectional impedance synthesizer corresponding with the circuit shown in FIG. 3A, in which the impedances of the active network are selected to simulate a GIS coupling impedance which is a capacitive reactance.

Similarly, by employing resistances $R_1=Z_1$ except for a capacitance $C_3$ to produce a capacitive reactance for $Z_3$, as shown in FIG. 4B, the GIS coupling impedance becomes $$Z_{GIS}=1/j\omega(R_1R_0/R_2R_4C_3),$$

which is a capacitive reactance.

The GIS synthesizers of conventional capacitance have proven to be unstable. The following analysis shows why one GIS capacitor has better than zero internal resistance. It is readily understood that a capacitor will discharge through a negative resistance only while time is proceeding in reverse. This discovery of reversed discharging (or self-charging) could have been predicted with the following analysis that exposes parasitic impedance in the GIS capacitor realized by the circuit of FIG. 4B.

This analysis is pursued in time domain because it contains variables ($k_0$ and $k_1$), whose time-dependent behavior is more easily conceived than their frequency-dependent behavior.

The differential amplifiers 20, 22 of FIG. 4B have finite output impedances and each drives a finite load. To account for the consequent discrepancies, the respective output potentials may be multiplied by the correction factors $k_1$, each approximately 1, but varying slightly with the output currents. Accordingly, $$v_1=k_1[e+(R_2/R_1)(e-e_A)], \text{ and}$$

$$v_0=k_0[e+R_4C_3d(e-v_1)/dt].$$

Eliminating $v_1$ and solving for the coupling current, neglecting the terms containing $dk_1/dt$, $$i=k_0k_1(R_2R_4C_3/R_0R_1)d(e-e_A)/dt+$$
$$[(1-k_0)-k_0(1-k_1)C_3R_4d/dt]e/R_0$$

Here, the latter term that operates on e represents an error admittance that couples the passive terminal T to ground. It is made up of a real conductance and an imaginary susceptance, respectively. If the real conductance is negative, that is, if $k_0>1$, then the negative coupling resistance will render the GIS capacitor self-charging. At times when the capacitor is being charged during normal operation, the final differential amplifier output 22C is sinking charge (and positive energy) through $R_0$, entering from the passive source. Its "load" thence boosts its output potential, due to the differential amplifier's finite output impedance. This forces $k_0>1$, causing the error conductance to be negative The corresponding negative resistance is absolutely negative, and it can only produce energy, quite opposite the behavior of positive resistances. Its energy production, if not suitably neutralized, will cause e to be attracted to either extreme output potential accessible from the final op-amp 22.

Figure 5:
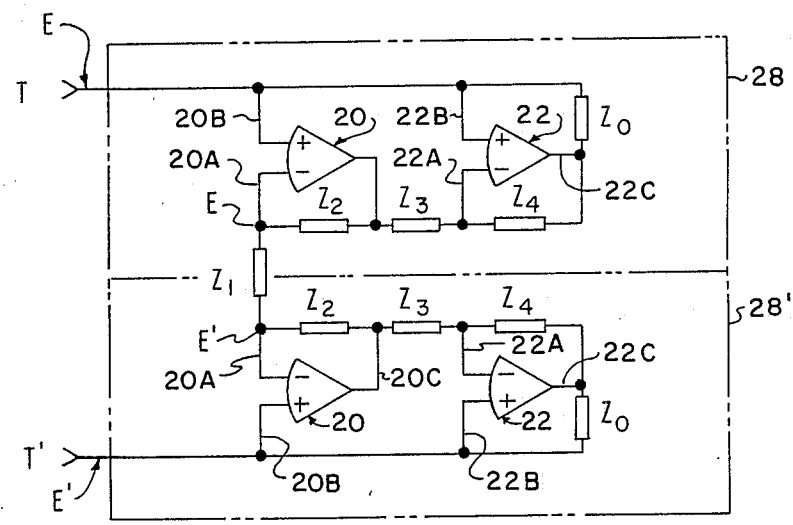
FIG. 5 is a circuit diagram which illustrates two identical MGIS impedances connected in series through their autonomous terminals to realize a bidirectional impedance simulator; and, FIG. 6 is a circuit diagram for the n-stage monodirectional general impedance synthesizer (MGIS).

Two identical MGIS impedances 28, 28' may be wired in series through their autonomous terminals as shown in FIG. 5, wherein each of the inverted inputs to the first stages serves as the autonomous terminal for the opposite MGIS. Such a bidirectional generalized impedance synthesizer (BGIS) simulates a conventional floating gyrator.

Because the GIS impedance contains five alternative components $Z_i$, up to five 90° phase shifts may be introduced into the two stage GIS impedance, each bearing a frequency factor on the magnitude of the impedance. For example, by employing capacitances $C_1$ and $C_3$ to produce impedances $Z_1$ and $Z_3$, and inductances $L_2$ and $L_4$ to produce impedances $Z_2$ and $Z_4$, the four phase shifts and frequency factors produce a GIS impedance of $$Z_{GIS}=R_0/C_1L_2C_3L_4W^4,$$

where $w=2\pi f$ and $Z_{GIS}$ is a positive resistance that is heavily sensitive to frequency f and yet free of phase distortions.

If natural inductors are employed in such a configuration, a rather large pair of internal inductor resistances may be needed in the computation of $Z_{GIS}$. The compensated result may show the real portion of $Z_{GIS}$ to be negative at some frequencies, and substantial distortions of the imaginary component may also appear. However, one terminal of each $Z_i$ is autonomous, and any of these may be simulated by an MCRIM or MGIS if desired.

It will be appreciated that the general impedance synthesizer may be realized by one or more amplifier stages as shown in FIGS. 6. A one stage general impedance synthesizer which has proven particularly useful is the one stage negative resistance configuration where $Z_{GIS}=-R_0R_1/R_2$. The one stage GIS circuit is useful for exciting natural oscillation in real RLC circuits, for it neutralizes the internal resistance of the real components. The one stage GIS therefore constitutes an all purpose replacement for the active sections of several important oscillator circuits.

It may be shown that the coupling impedance of the general n-stage MGIS is $$Z_{GIS}^{(n)} = (E-E_A)/I = (-1)^n Z_0 \prod_{k=1}^{n} Z_{2k-1}/Z_{2k}.$$

The monodirectional general impedance synthesizer circuit is realized by n (one or more) cascaded differential amplifier stages numbered in sequence from 1 through n, the inverting input of each stage number k being coupled to its own output potential through an impedance $Z_{2k}$, and being also coupled to the output potential of its preceding stage (number $k-1$) through an impedance $Z_{2k}-1$, with the one exception that the "output potential" of the "stage" preceding the first stage is defined to be the autonomous potential $E_A$, taken from the autonomous terminal of the MGIS. The noninverting input of every stage number k is connected directly to the passive terminal of potential E, and the impedance $Z_0$ couples the passive potential E to the output $V_n$ of the final (nth) stage.

Although preferred embodiments of the invention have been described in detail, it should be understood that various substitutions, alterations and modifications can be made without departing from the spirit and scope of the invention as defined in the appended claims.

What is claimed is:

1. A network for simulating an impedance having a passive source terminal and an autonomous source terminal for coupling a passive source potential to an autonomous source potential, respectively, said network comprising, in combination:

a potentiometer having a maximum resistance value R connected across said passive source terminal and said autonomous source terminal, said potentiometer having a divider tap dividing said potentiometer into a first section having a resistance value $R_T$ and a second section having a resistance value $R-R_T$, thereby defining a voltage divider circuit;

a unity gain voltage follower amplifier having an input terminal and an output terminal, the input terminal of said voltage follower amplifier being connected to the divider tap of said potentiometer; and an impedance $Z_0$ being coupled between the output terminal of said voltage follower amplifier and said passive source terminal.

2. A network for simulating a monodirectional general impedance, said network having a passive source terminal and an autonomous source terminal for coupling a passive source potential to an autonomous source potential, respectively, said network comprising, in combination:

first and second pairs of impedances ($Z_1$, $Z_2$) and ($Z_3$, $Z_4$);

first and second cascaded differential amplifier stages, each differential amplifier stage including a differential amplifier having an inverting input terminal, a noninverting input terminal and an output terminal;

the first stage inverting input terminal being coupled to the autonomous source terminal by the impedance $Z_1$ and also being coupled to the first stage output terminal by the impedance $Z_2$;

the second stage inverting input terminal being coupled to the output terminal of the first stage by the impedance $Z_3$ and also being coupled to the second stage output terminal by the impedance $Z_4$;

the non-inverting input terminal of the differential amplifier in each stage being connected to the passive source terminal; and, an impedance $Z_0$ connecting the passive source terminal to the output terminal of the second differential amplifier stage.

3. A method for simulating a floating two terminal electrical impedance $Z_{SIM}$ for coupling a first terminal of potential E to a second terminal of potential $E_A$ comprising the steps:

directly coupling the terminal of potential E through a preselected impedance $Z_0$ to the output of an amplifier;

driving the input of said amplifier to generate a potential v on the output of said amplifier, where v is a function of $E-E_A$; and, controlling the potential v on the output of said amplifier for the purpose of causing the current I entering the terminal of potential E to satisfy the relation:

$$I=(E-V)/Z_0=(E-E_A)/Z_{SIM}.$$

4. A network for simulating a monodirectional impedance having a passive terminal and an autonomous terminal, said network simulating an impedance coupling said passive terminal to the potential externally applied at said autonomous terminal, said network comprising, in combination:

a differential-voltage amplifier having an inverting input terminal, a non-inverting input terminal and an output terminal, said non-inverting input terminal of said differential-voltage amplifier being connected to said passive terminal;

a first impedance coupling said passive terminal of said network to the potential of said output terminal of said differential-voltage amplifier;

a second impedance coupling said inverting input terminal of said differential-voltage amplifier to the potential of said output terminal of said differential-voltage amplifier;

a third impedance coupling said inverting input terminal of said differential-voltage amplifier to the potential of said autonomous terminal of said network.

5. A network for simulating a monodirectional impedance having a passive terminal and an autonomous terminal, said network simulating an impedance $Z_{SIM}$ for coupling said passive terminal, having potential E, to the potential $E_A$ externally applied at said autonomous terminal, said network comprising, in combination:

an amplifier, an impedance $Z_0$ coupling said passive terminal to an output terminal of said amplifier, and means coupled to the input of said amplifier for causing the potential V on said output terminal of said amplifier to identically satisfy the equation $$(E-V)/Z_0=(E-E_A)/Z_{SIM}.$$

* * * * *